(12) United States Patent
Tsuchiya et al.

(10) Patent No.: US 10,006,966 B2
(45) Date of Patent: Jun. 26, 2018

(54) BATTERY VOLTAGE DETECTION DEVICE

(71) Applicant: KEIHIN CORPORATION, Shinjuku-ku, Tokyo (JP)

(72) Inventors: Shingo Tsuchiya, Utsunomiya (JP); Seiji Kamata, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 106 days.

(21) Appl. No.: 15/057,655

(22) Filed: Mar. 1, 2016

(65) Prior Publication Data
US 2016/0291091 A1 Oct. 6, 2016

(30) Foreign Application Priority Data
Mar. 31, 2015 (JP) .................................. 2015-073627

(51) Int. Cl.
*G01R 31/36* (2006.01)
(52) U.S. Cl.
CPC ....... *G01R 31/3658* (2013.01); *G01R 31/362* (2013.01); *G01R 31/3675* (2013.01)
(58) Field of Classification Search
CPC .............. G01R 31/3658; G01R 31/362; G01R 31/3675
USPC ........................................................ 324/434
See application file for complete search history.

(56) References Cited

U.S. PATENT DOCUMENTS

| 5,465,201 | A | * | 11/1995 | Cohen | H02M 3/33507 |
| | | | | | 323/284 |
| 6,157,165 | A | * | 12/2000 | Kinoshita | H02J 7/0019 |
| | | | | | 320/116 |
| 7,313,333 | B2 | * | 12/2007 | Lee | H04B 10/695 |
| | | | | | 398/204 |
| 7,759,903 | B2 | * | 7/2010 | Kamata | G01R 31/362 |
| | | | | | 320/132 |
| 9,488,696 | B2 | * | 11/2016 | Matsumoto | G01R 31/3658 |
| 9,638,760 | B2 | * | 5/2017 | Hebiguchi | G01R 31/3662 |
| 9,671,469 | B2 | * | 6/2017 | Koduka | G01R 31/3606 |
| 2004/0051534 | A1 | * | 3/2004 | Kobayashi | G01R 19/16542 |
| | | | | | 324/429 |
| 2009/0295398 | A1 | * | 12/2009 | Ohnuki | B60L 11/1851 |
| | | | | | 324/429 |
| 2011/0031812 | A1 | * | 2/2011 | Morimoto | G01R 19/10 |
| | | | | | 307/77 |
| 2012/0212871 | A1 | * | 8/2012 | Taniguchi | G01R 31/3624 |
| | | | | | 361/87 |

(Continued)

FOREIGN PATENT DOCUMENTS

CN 201237635 Y 5/2009
CN 103444046 A 12/2013

(Continued)

OTHER PUBLICATIONS

CNOA corresponding to Application No. 201610186687.1; Mailing date of Mar. 30 2018.

*Primary Examiner* — M'Baye Diao
(74) *Attorney, Agent, or Firm* — Cantor Colburn LLP

(57) ABSTRACT

A battery voltage detection device includes a battery; a voltage detection circuit; and a low-pass filter provided between the battery and the voltage detection circuit. The low-pass filter includes a capacitor of which one end is connected to a terminal of the battery and the other end is connected to a voltage source outputting a voltage higher than a terminal voltage of the battery.

2 Claims, 3 Drawing Sheets

(56) References Cited

U.S. PATENT DOCUMENTS

| | | | | |
|---|---|---|---|---|
| 2013/0113529 A1* | 5/2013 | Pearson | ............... | H03K 5/156 327/122 |
| 2014/0266050 A1* | 9/2014 | Biskup | ............... | H02J 7/0016 320/118 |
| 2015/0162759 A1* | 6/2015 | Fujii | ............... | H01M 10/425 320/118 |

FOREIGN PATENT DOCUMENTS

| | | | |
|---|---|---|---|
| CN | 103568859 | A | 2/2014 |
| CN | 104049136 | A | 9/2014 |
| JP | 2010181168 | A | 8/2010 |
| JP | 2013094032 | A | 5/2013 |
| JP | 5634694 | B2 | 12/2014 |
| WO | 2013038762 | A1 | 3/2013 |

* cited by examiner

BATTERY VOLTAGE DETECTION DEVICE

CROSS-REFERENCE TO RELATED APPLICATION

The present invention claims priority under 35 U.S.C. § 119 to Japanese Application No. 2015-073627, filed on Mar. 31, 2015, the entire content of which is incorporated herein by reference.

BACKGROUND OF THE INVENTION

Field of the Invention

The present invention relates to a battery voltage detection device.

Description of Related Art

Japanese Unexamined Patent Application, First Publication No. 2013-094032 (hereinafter, referred to as Patent Document 1) discloses that, in a monitoring device of a battery system (battery system monitoring device) including a cell group in which a plurality of unit battery cells are connected in series with each other, an RC filter is provided between each unit battery cell and a controller IC which measures an inter-terminal voltage of each unit battery cell (for example, refer to FIGS. 2 to 4). The RC filter is a circuit constituted of a resistor and a capacitor and is used to remove noise.

SUMMARY OF THE INVENTION

In this related art, in a case where a capacitor deteriorates and thus internal resistance is reduced, there is a concern that an inter-terminal voltage of the unit battery cell may be detected as a value lower than an original value. In other words, in the technique disclosed in Patent Document 1, since the other end of the capacitor is connected to a ground terminal, in a case where the capacitor deteriorates and thus internal resistance is reduced, a voltage division ratio of an input resistor and the capacitor is reduced. Therefore, an inter-terminal voltage of the unit battery cell is detected as a value lower than an inter-terminal voltage (original value) in a state in which the capacitor is favorable. If an inter-terminal voltage is detected as a value lower than the original value due to deterioration in a component (capacitor), there is a concern that overcharge of the battery may be missed, and thus this is not preferable in monitoring the state of the battery.

An aspect related to the present invention has been made in consideration of the above-described circumstances, and an object of the present invention is to provide a battery voltage detection device capable of reducing the chance due to the deterioration of a component where an inter-terminal voltage of a battery is detected as a value lower than the value before deterioration, or capable of detecting, even if the component deteriorates, an inter-terminal voltage of the battery as a value higher than the value before the deterioration.

The present invention employs the following aspect in order to solve the above-described problems and to achieve the related object.

(1) According to an aspect of the present invention, there is provided a battery voltage detection device includes a battery; a voltage detection circuit; and a low-pass filter provided between the battery and the voltage detection circuit, the low-pass filter including a capacitor of which one end is connected to a terminal of the battery and the other end is connected to a voltage source outputting a voltage higher than a terminal voltage of the battery.

(2) In the battery voltage detection device of the aspect according to the above (1), the battery may be a battery pack in which a plurality of unit batteries are connected in series with each other, the low-pass filter may be provided for each of the unit batteries, and all or some of the other ends of the capacitors may be connected to a voltage source outputting a voltage higher than a terminal voltage of the unit battery.

(3) In the battery voltage detection device of the aspect according to the above (1), the battery may be a battery pack in which a plurality of unit batteries are connected in series with each other, the low-pass filter may be provided for each of the unit batteries, and each of the other ends of the capacitors may be connected to a voltage source outputting a voltage obtained by adding a predetermined voltage to a terminal voltage of the unit battery corresponding thereto.

According to the aspect related to the present invention, the capacitor of the low-pass filter provided between the battery and the voltage detection circuit has one end connected to the terminal of the battery and the other end connected to the voltage source outputting a voltage higher than a terminal of the battery. For this reason, it is possible to provide a battery voltage detection device capable of reducing the chance that an inter-terminal voltage of a battery is detected as a value lower than a value before deterioration due to the deterioration in a component.

DETAILED DESCRIPTION OF THE INVENTION

Hereinafter, with reference to the drawings, embodiments of the present invention will be described.

First Embodiment

Figure 1:
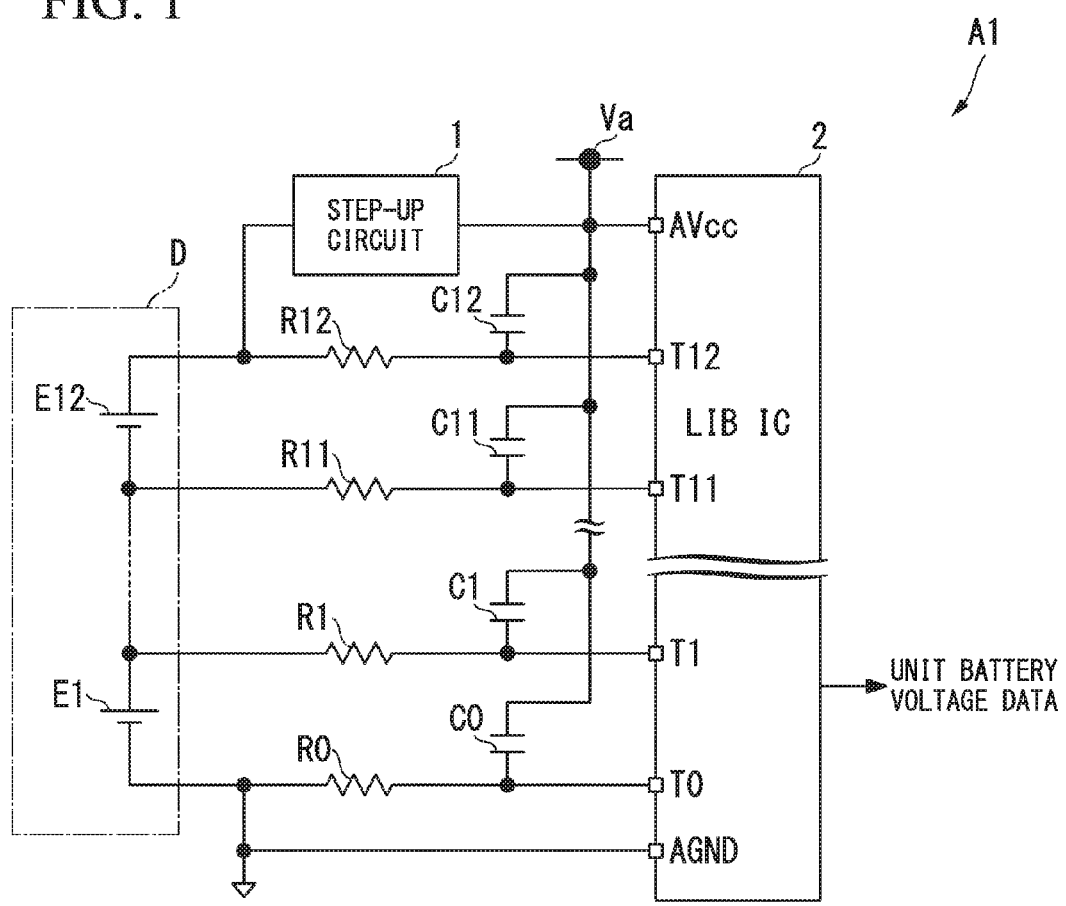
FIG. 1 is a circuit diagram illustrating a main portion configuration of a battery voltage detection device A1 according to a first embodiment of the present invention.

First, a first embodiment of the present invention will be described with reference to FIG. 1. As illustrated in FIG. 1, a battery voltage detection device A1 according to the first embodiment has a battery pack D including a plurality of (twelve) unit batteries E1 to E12 as a detection target, and includes thirteen resistors R0 to R12, thirteen capacitors C0 to C12, a step-up circuit 1 (voltage source), and a voltage detection IC 2 (voltage detection circuit).

The twelve unit batteries E1 to E12 are connected in series with each other. In other words, a positive terminal of the first unit battery E1 is connected to a negative terminal of the second unit battery E2, and a positive terminal of the second unit battery E2 is connected to a negative terminal of the third unit battery E3. In the same manner, the batteries from the third unit battery E3 to the eleventh unit battery E11 are sequentially connected in series with each other, and a positive terminal of the eleventh unit battery E11 is connected to a negative terminal of the twelfth unit battery E12. As mentioned above, in the battery pack D in which the twelve unit batteries E1 to E12 are connected in series with each other, the negative terminal of the first unit battery E1 has the lowest potential, and the positive terminal of the twelfth unit battery E12 has the highest potential (battery highest potential Vm).

The terminals of the unit batteries E1 to E12 are connected to input terminals T0 to T12 of the voltage detection IC 2 via any one of the resistors R0 to R12, respectively. In other words, the negative terminal of the first unit battery E1 is connected to the input terminal T0 of the voltage detection IC 2 via the resistor R0, and the positive terminal of the first unit battery E1 and the negative terminal of the second unit battery E2 are connected to the input terminal T1 of the voltage detection IC 2 via the resistor R1. The negative terminal of the first unit battery E1 is grounded as illustrated in FIG. 1.

The positive terminal of the second unit battery E2 to the negative terminal of the eleventh unit battery E11 are not described. The negative terminal of the twelfth unit battery E12 and the positive terminal of the eleventh unit battery E11 are connected to the input terminal T11 of the voltage detection IC 2 via the resistor R11, and the positive terminal of the twelfth unit battery E12 is connected to the input terminal T12 of the voltage detection IC 2 via the resistor R12. The positive terminal of the twelfth unit battery E12 is also connected to an input terminal of the step-up circuit 1.

In other words, the thirteen resistors R0 to R12 are provided so as to respectively correspond to the unit batteries E1 to E12. Among the resistors R0 to R12, the resistor R0 has one end connected to the negative terminal of the first unit battery E1 and the other end connected to the input terminal T0 of the voltage detection IC 2.

The resistor R1 has one end connected to the positive terminal of the first unit battery E1 and the negative terminal of the second unit battery E2, and the other end connected to the input terminal T1 of the voltage detection IC 2.

The resistors R2 to R10 are not described. The resistor R11 has one end connected to the positive terminal of the eleventh unit battery E11 and the negative terminal of the twelfth unit battery E12, and the other end connected to the input terminal T11 of the voltage detection IC 2. The resistor R12 has one end connected to the positive terminal of the twelfth unit battery E12 and the other end connected to the input terminal T12 of the voltage detection IC 2.

The thirteen capacitors C0 to C12 are provided so as to respectively correspond to the terminals of the unit batteries E1 to E12 in the same manner as the resistors R0 to R12. One ends of the capacitors C0 to C12 are connected to the other ends of the resistors R0 to R12 which respectively correspond to the capacitors C0 to C12, that is, the input terminals T0 to T12 of the voltage detection IC 2, and all the other ends thereof are connected to an analog power source with a voltage Va. In other words, among the thirteen capacitors C0 to C12, the capacitor C0 has one end connected to the other end of the resistor R0, that is, the input terminal T0 of the voltage detection IC 2, and the other end connected to the analog power source.

The capacitor C1 has one end connected to the other end of the resistor R1, that is, the input terminal T1 of the voltage detection IC 2, and the other end connected to the analog power source. The capacitors C2 to C10 are not described. The capacitor C11 has one end connected to the other end of the resistor R11, that is, the input terminal T11 of the voltage detection IC 2, and the other end connected to the analog power source. The capacitor C12 has one end connected to the other end of the resistor R12, that is, the input terminal T12 of the voltage detection IC 2, and the other end connected to the analog power source.

Here, a pair of the resistor and the capacitor whose one ends or the other ends have a connection relationship constitutes an RC filter. In other words, the resistor R0 and the capacitor C0 constitute a single RC filter; the resistor R1 and the capacitor C1 constitute a single RC filter; the resistor R2 and the capacitor C2 constitute a single RC filter; the resistor R3 and the capacitor C3 constitute a single RC filter; the resistor R4 and the capacitor C4 constitute a single RC filter; the resistor R5 and the capacitor C5 constitute a single RC filter; and the resistor R6 and the capacitor C6 constitute a single RC filter.

The resistor R7 and the capacitor C7 constitute a single RC filter; the resistor R8 and the capacitor C8 constitute a single RC filter; the resistor R9 and the capacitor C9 constitute a single RC filter; the resistor R10 and the capacitor C10 constitute a single RC filter; the resistor R11 and the capacitor C11 constitute a single RC filter; and the resistor R12 and the capacitor C12 constitute a single RC filter. Each of the thirteen RC filters is provided between each of the unit batteries E1 to E12 corresponding thereto and the voltage detection IC 2.

Each of the thirteen RC filters functions as a low-pass filter. In other words, terminal voltages of the unit batteries E1 to E12 pass through the RC filters so that noise is removed therefrom, and are then input to the input terminals T0 to T12 of the voltage detection IC 2.

The step-up circuit 1 is a voltage source which steps up a voltage (highest potential Vm) of the positive terminal of the twelfth unit battery 12 so as to supply the power source voltage Va to the above-described analog circuit portion. The power source voltage Va is a potential obtained by adding a predetermined additional voltage (for example, 5 V) to the highest potential Vm. In the battery pack D, the twelve unit batteries E1 to E12 are connected in series with each other as described above. Therefore, among the twelve unit batteries E1 to E12, the negative terminal of the first unit battery E1 has the lowest potential, and the positive terminal of the twelfth unit battery E12 has the highest potential. In other words, the step-up circuit 1 supplies the power source voltage Va obtained by adding the additional voltage to the highest potential Vm of the battery pack D, that is, a voltage which is necessary in order to normally operate the voltage detection IC 2, to the voltage detection IC 2 as power.

The voltage detection IC 2 is a voltage detection circuit which obtains differences (difference voltages) of terminal voltages of the unit batteries E1 to E12 which are input to the input terminals T0 to T12 as analog signals so as to generate inter-terminal voltages (unit battery voltages) of the unit batteries E1 to E12 and also to convert the inter-terminal voltages (unit battery voltages) into digital signals (unit battery voltage data) which are then output to an external calculation device. More specifically, the voltage detection IC 2 is provided with an analog circuit portion and a digital circuit portion, and the analog circuit portion detects the unit battery voltage and performs conversion into the unit battery voltage data. The digital circuit portion carries the unit battery voltage data on a communication signal (communication frame) based on a predetermined communication specification and transmits the unit battery voltage data to an external device.

In the voltage detection IC 2, an analog power source terminal Vcc and an analog ground terminal AGND are terminals for supplying power to the analog circuit portion. The analog circuit portion processes the battery highest potential Vm which is input to the input terminal T12, and thus the voltage detection IC 2 requires an analog power source voltage higher than the battery highest potential Vm. The analog circuit portion of the voltage detection IC 2 is operated by using the power source voltage Va supplied from the step-up circuit 1 as power.

Next, a description will be made of an operation of the battery voltage detection device A1 configured as mentioned above.

In the battery voltage detection device A1, a total of thirteen terminal voltages of the unit batteries E1 to E12 are input to the input terminals T0 to T12 of the voltage detection IC 2 via the RC filters. The voltage detection IC 2 detects inter-terminal voltages of the unit batteries E1 to E12, that is, unit battery voltages on the basis of the terminal voltages of the unit batteries E1 to E12 which are input to the input terminals T0 to T12, and converts each of the unit battery voltages into unit battery voltage data which is then output to an external device.

The above description relates to a main operation of the battery voltage detection device A1, and, in the battery voltage detection device A1, the power source voltage Va is supplied to the other end of the thirteen capacitors C0 to C12 constituting the RC filters. The power source voltage Va is set to a potential which is higher than the battery highest potential Vm by the additional voltage as described above. In other words, even if the capacitors C0 to C12 deteriorate, and thus internal resistance is reduced, there is no case where terminal voltages of the unit batteries E1 to E12 which are input to the input terminals T0 to T12 of the voltage detection IC 2 are read as being lower than during normal times of the capacitors C0 to C12.

Here, as is well known, the capacitor is a circuit element in which a resistance value (impedance) for a DC voltage is theoretically infinite, and the resistance value (impedance) is considerably great in an actual case. Therefore, in a state in which the capacitors C0 to C12 are favorable, terminal voltages of the unit batteries E1 to E12 are input to the input terminals T0 to T12 of the voltage detection IC 2 almost without undergoing voltage drop in the RC filters.

However, if the capacitors C0 to C12 deteriorate, the resistance value (impedance) in each of the capacitors C0 to C12 is reduced, and thus the extent of the voltage drop of the terminal voltages of the unit batteries E1 to E12 in the RC filters increases. In a case where potentials lower than the terminal voltages of the unit batteries E1 to E12 are supplied to the other ends of the capacitors C0 to C12 (that is, in a case of the related art), voltages output from the RC filters are lower than the terminal voltages of the unit batteries E1 to E12. As a result, voltages lower than voltages which are to be originally input are input to the input terminals T0 to T12 of the voltage detection IC 2.

In contrast, according to the first embodiment, the other ends of the capacitors C0 to C12 are supplied with a potential higher than the terminal voltages of the unit batteries E1 to E12, that is, the power source voltage Va, and, thus, even if the capacitors C0 to C12 deteriorate, there is no case where the terminal voltages of the unit batteries E1 to E12 are detected as being lower than during normal times of the capacitors C0 to C12 by the voltage detection IC 2. Therefore, according to the first embodiment, it is possible to prevent a situation in which each of the unit batteries E1 to E12 is overcharged due to deterioration in the capacitors C0 to C12.

Second Embodiment

Next, with reference to FIG. 2, a second embodiment of the present invention will be described.

Figure 2:
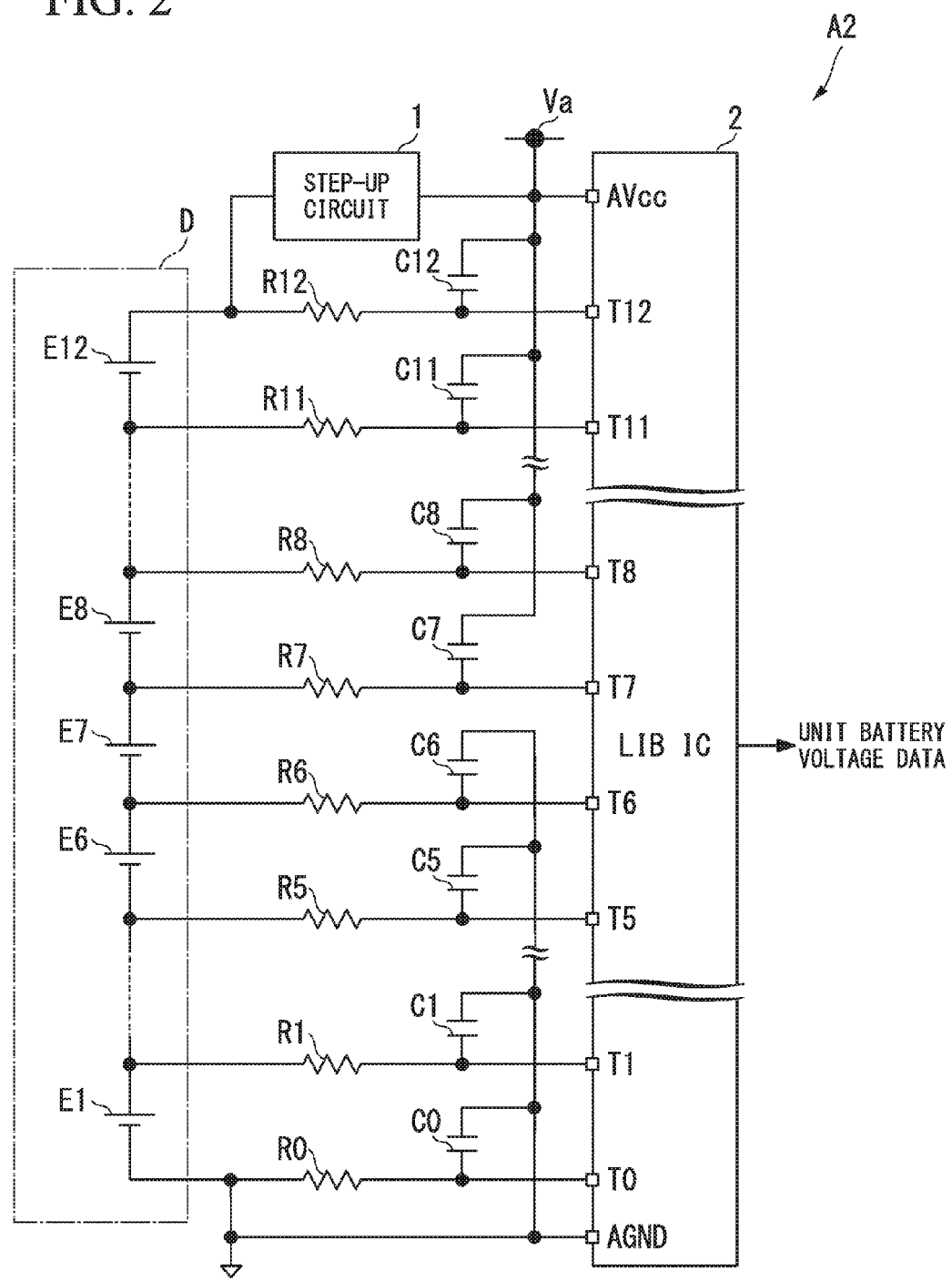
FIG. 2 is a circuit diagram illustrating a main portion configuration of a battery voltage detection device A2 according to a second embodiment of the present invention.

In a battery voltage detection device A2 according to the second embodiment, as illustrated in FIG. 2, among the other ends of thirteen capacitors C0 to C12, the other ends of the capacitors C0 to C6 are grounded, and the other ends of the remaining capacitors C7 to C12, that is, parts of the other ends of the thirteen capacitors C0 to C12 are supplied with the power source voltage Va. In other words, the battery voltage detection device A2 is different from the battery voltage detection device A1 according to the first embodiment only in that the other ends of the capacitors C0 to C6 are grounded.

Here, among terminal voltages of twelve unit batteries E1 to E12, the terminal voltages of the unit batteries E1 to E6 are lower than the terminal voltages of the unit batteries E7 to E12. In other words, in a case where the other ends of the thirteen capacitors C0 to C12 are grounded, the extent of voltage drop of the terminal voltages of the unit batteries E1 to E12 in the RC filters is lower in the terminal voltages of the unit batteries E1 to E6 than in the terminal voltages of the unit batteries E7 to E12. Therefore, an influence of voltage drop in the RC filters in a case where the capacitors C0 to C12 deteriorate is smaller in the terminal voltages of the unit batteries E1 to E6 than in the unit batteries E7 to E12.

The battery voltage detection device A2 according to the second embodiment is made in consideration of the fact that the influence of voltage drop in the RC filter differs depending on the unit batteries E1 to E12. Regarding the unit batteries E7 to E12 on which the influence is relatively high, the other ends of the capacitors C7 to C12 are supplied with the power source voltage Va, and, thus, in a case where the capacitors C7 to C12 deteriorate, it is possible to prevent a situation in which terminal voltages of the unit batteries E7 to E12 are read as being lower than during normal times of the capacitors C7 to C12 by the voltage detection IC 2.

In the second embodiment, the other ends of the capacitors C7 to C12 are supplied with the power source voltage Va, but targets supplied with the power source voltage Va are not limited to the capacitors C7 to C12. For example, the power source voltage Va may be supplied to the capacitors C6 to C12 or the capacitors C8 to C12, or may be supplied to other capacitors.

Third Embodiment

Finally, a third embodiment of the present invention will be described with reference to FIG. 3.

Figure 3:
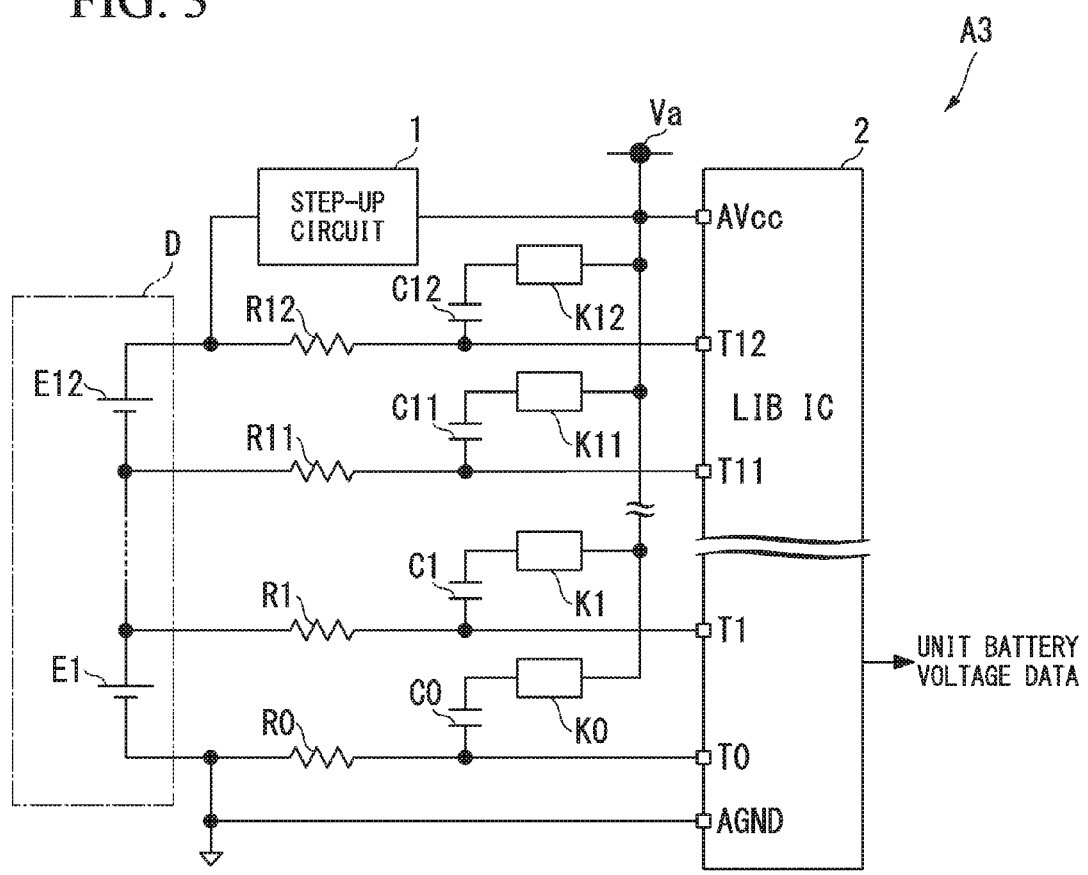
FIG. 3 is a circuit diagram illustrating a main portion configuration of a battery voltage detection device A3 according to a third embodiment of the present invention.

A battery voltage detection device A3 according to the third embodiment, as illustrated in FIG. 3, includes thirteen reference voltage sources K0 to K12, and the other ends of the capacitors C0 to C12 are respectively connected to output ends of the corresponding reference voltage sources K0 to K12.

The reference voltage sources K0 to K12 are supplied with the power source voltage Va as input voltages, and output voltages which are higher than terminal voltages of the unit batteries E1 to E6 corresponding thereto by a predetermined voltage Vh. For example, the reference voltage source K0 is provided to correspond to the negative terminal of the unit battery E1, and outputs a voltage ($V1m+Vh$) obtained by adding the predetermined voltage Vh to a terminal voltage $V1m$ of the negative terminal of the unit battery E1.

The reference voltage source K1 is provided to correspond to the positive terminal of the unit battery E1, and outputs a voltage ($V1p+Vh$) obtained by adding the predetermined voltage Vh to a terminal voltage $V1p$ (for example, a terminal voltage in a full-charge state of the unit battery E1) of the positive terminal of the unit battery E1. In the same manner, the remaining reference voltage sources K2 to K12 are provided to respectively correspond to the positive terminals of the unit batteries E2 to E12, and output voltages obtained by adding the predetermined voltage Vh to terminal voltages $V2p$ to $V12p$ (terminal voltages in a full-charge state of the unit batteries E2 to E12) of the positive terminals of the unit batteries E2 to E12.

Here, for example, in the battery voltage detection device A1 according to the first embodiment, all the other ends of the capacitors C0 to C12 are supplied with the same voltage, that is, the power source voltage Va, and thus a voltage difference between both ends of each of the capacitors C0 to C12 differs. Therefore, in the battery voltage detection device A1 according to the first embodiment, in a case where the capacitors C0 to C12 deteriorate, voltage drop in the RC filter differs for each RC filter. Such a property is also the same for the battery voltage detection device A2 according to the second embodiment.

In contrast, according to the battery voltage detection device A3 of the third embodiment, a voltage difference between both ends of each of the capacitors C0 to C12 is uniform for all of the capacitors C0 to C12 when each of the unit batteries E1 to E12 is in a full-charge state. Therefore, in the battery voltage detection device A3 according to the third embodiment, since voltage drop in the RC filter occurs in all of the RC filters in the same manner in a case where the capacitors C0 to C12 deteriorate, the influence of deterioration in the capacitors C0 to C12 can be uniformly exerted on all of the unit batteries E1 to E12.

According to the battery voltage detection device A3 of the third embodiment, since the other ends of all of the capacitors C0 to C12 are supplied with voltages higher than terminal voltages of the unit batteries E1 to E12, even if each of the capacitors C0 to C12 deteriorates, there is no case where the terminal voltages of the unit batteries E1 to E12 are read as being lower than during normal times of the capacitors C0 to C12 by the voltage detection IC 2. Therefore, according to the third embodiment, it is possible to prevent a situation in which each of the unit batteries E1 to E12 is overcharged due to deterioration in the capacitors C0 to C12.

The present invention is not limited to the above-described embodiments, and may employ the following modification examples, for example.

(1) In the above-described embodiments, the battery pack D including a total of twelve unit batteries E1 to E12 is set as a voltage detection target, but the present invention is not limited thereto. The present invention is also applicable to a single unit battery, and is also applicable to a battery pack including a number of unit batteries other than twelve.

(2) In the above-described embodiments, each of the RC filters is provided between each of the unit batteries E1 to E12 and the voltage detection IC 2, but the present invention is not limited thereto. The RC filter is a low-pass filter used to remove noise, and thus the present invention is also applicable to a battery voltage detection device including a low-pass filter with other circuit configurations. The present invention is also applicable to a battery voltage detection device including, for example, an LC filter instead of the RC filter.

What is claimed is:

1. A battery voltage detection device comprising:
   a battery;
   a voltage detection circuit; and
   a low-pass filter provided between the battery and the voltage detection circuit,
   wherein the low-pass filter includes a capacitor of which one end is connected to a terminal of the battery and the other end is connected to a voltage source outputting a voltage higher than a terminal voltage of the battery;
   wherein the battery is a battery pack in which a plurality of unit batteries are connected in series with each other;
   wherein the low-pass filter is provided for each of the unit batteries, and
   wherein each of the other ends of the capacitors is connected to the voltage source via a reference voltage source outputting a voltage obtained by adding a predetermined voltage to a terminal voltage of the unit battery corresponding thereto.

2. The battery voltage detection device according to claim 1,
   wherein some of the other ends of the capacitors are connected to the voltage source via the reference voltage source and the others of the other ends of the capacitors are grounded.

* * * * *